United States Patent
Schneider

(10) Patent No.: US 12,259,411 B2
(45) Date of Patent: Mar. 25, 2025

(54) METHOD FOR CHECKING THE PLAUSIBILITY OF A CURRENT MEASUREMENT BETWEEN AN ELECTRICAL ENERGY STORAGE SYSTEM AND AN ELECTRICAL CONSUMER

(71) Applicant: Robert Bosch GmbH, Stuttgart (DE)

(72) Inventor: Johannes Schneider, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 18/558,280

(22) PCT Filed: Apr. 7, 2022

(86) PCT No.: PCT/EP2022/059223
§ 371 (c)(1),
(2) Date: Oct. 31, 2023

(87) PCT Pub. No.: WO2022/233529
PCT Pub. Date: Nov. 10, 2022

(65) Prior Publication Data
US 2024/0219433 A1    Jul. 4, 2024

(30) Foreign Application Priority Data
May 3, 2021   (DE) .................... 10 2021 204 397.6

(51) Int. Cl.
*G01R 19/00* (2006.01)
*G01R 31/327* (2006.01)
(Continued)

(52) U.S. Cl.
CPC ..... *G01R 19/0046* (2013.01); *G01R 31/3274* (2013.01); *G01R 31/40* (2013.01);
(Continued)

(58) Field of Classification Search
CPC  G01R 19/0046; G01R 31/3274; G01R 31/40; H02J 7/00712; H02J 1/10; H02J 7/0047; H02J 7/0063; H02J 7/345
See application file for complete search history.

(56) References Cited

U.S. PATENT DOCUMENTS

2013/0335100 A1   12/2013   Boehm
2014/0009090 A1   1/2014   Ashida et al.
(Continued)

FOREIGN PATENT DOCUMENTS

| | | |
|---|---|---|
| CN | 112462315 A | 3/2021 |
| DE | 102014219806 A1 | 3/2016 |
| JP | 3668145 B2 | 7/2005 |

OTHER PUBLICATIONS

Translation of International Search Report for Application No. PCT/EP2022/059223 dated Jun. 28, 2022 (2 pages).

*Primary Examiner* — Carlos Amaya
(74) *Attorney, Agent, or Firm* — Michael Best & Friedrich LLP

(57) ABSTRACT

A method for checking the plausibility of a current measurement between an electrical energy storage system and an electrical consumer, wherein a capacitor and a switching element are arranged between these two elements. The method includes ascertaining a first current value by measuring an electrical current between the electrical energy storage system and the electrical consumer and actuating the switching element to isolate the electrical energy storage system from the electrical consumer so that the electrical consumer is supplied with electrical energy by the capacitor. The method further includes ascertaining a first electrical voltage at the capacitor, ascertaining a second current value depending on the ascertained voltage, and checking the plausibility of the current measurement by comparing the first current value with the second current value.

10 Claims, 4 Drawing Sheets

(51) Int. Cl.
*G01R 31/40* (2020.01)
*H02J 1/10* (2006.01)
*H02J 7/00* (2006.01)
*H02J 7/34* (2006.01)

(52) U.S. Cl.
CPC .............. *H02J 1/10* (2013.01); *H02J 7/0047* (2013.01); *H02J 7/0063* (2013.01); *H02J 7/00712* (2020.01); *H02J 7/345* (2013.01)

(56) References Cited

U.S. PATENT DOCUMENTS

2017/0331401 A1 11/2017 Sambonsuge et al.
2021/0394638 A1* 12/2021 Lepper ................... G01R 31/40

* cited by examiner

METHOD FOR CHECKING THE PLAUSIBILITY OF A CURRENT MEASUREMENT BETWEEN AN ELECTRICAL ENERGY STORAGE SYSTEM AND AN ELECTRICAL CONSUMER

BACKGROUND OF THE INVENTION

The present invention is based on a method for checking the plausibility of a current measurement between an electrical energy storage system and an electrical consumer.

Electrical energy storage systems with lithium iron phosphate chemistry (abbreviated as LFP chemistry), in particular batteries, can be particularly useful in certain battery systems given their low voltage design, e.g., an 12 V onboard system with a typical voltage range of 9 V-16 V, for which four LFP cells are sufficient. In addition, LFP cells are particularly safe, especially in case of overtemperature or short circuit.

The vehicular use of LFP batteries in safety-critical applications requiring a reliable prediction of the currently available battery power capacity and the amount of residual battery energy requires the ability to reliably determine the SOC, in particular knowledge of the lowest possible charging state at any given time.

Electrochemical properties of the LFP chemistry do not permit SOC determination via measurement of the OCV curve in wide ranges of the charging state because the OCV voltage hardly changes when the charging level changes due to, e.g., current removal. This results from a flat idle voltage characteristic curve for the LFP chemistry.

It is therefore advantageous to use a battery management system to continuously measure the current being drawn from a battery, i.e., to monitor the current in every battery management system mode, including in the standby mode, in which current draws can likewise be provided. For example, this can be required for a 12 V battery in order to suppy the vehicle at idle power.

The worst case charging state, i.e., the lowest possible residual energy quantity, which is important for safety-critical applications is thus directly influenced by the current measurement accuracy. During longer phases of in standby mode, even small measurement inaccuracies have a strong effect on the worst-case charging state and only enable a very conservative assessment of the same, so the battery performance currently available cannot be released to the vehicle or consumer and therefore cannot be used.

One important cause for limited measurement accuracy of a current measurement (for the relevant case of low current amplitudes considered herein) is in particular the EMC deviation of the sensor technology or a temperature-dependent offset inaccuracy of the analog-digital converter. Therefore, current measurement inaccuracies exist which must be retained all times, although the conditions leading to inaccuracy are not always present, in particular the aforementioned EMC faults or particularly in a low temperature range.

Publication US 2013/0335100 describes a method for verifying the proper functioning of a current sensor.

Publication DE102014219806A1 describes a device and a method for testing a functionality of a current sensor.

SUMMARY OF THE INVENTION

A method for checking the plausibility of a current measurement between an electrical energy storage system and an electrical consumer is disclosed by the features of the independent claim, whereby a capacitor and a switching element are arranged between the electrical energy storage system and the electrical consumer.

A first current value is in this case ascertained by measuring an electrical current between the electrical energy storage system and the electrical consumer.

Furthermore, the switching element is actuated to isolate the electrical energy storage system from the electrical consumer so that the electrical consumer is supplied with electrical energy by the capacitor.

A first electrical voltage is then ascertained at the capacitor, as well as a second current value depending on the ascertained voltage.

The plausibility of the current measurement is then checked by comparing the first current value with the second current value.

This method is advantageous because, in addition to the actual current measurement, the plausibility of the first current value measured is checked for whether a current flow is actually taking place, or whether a measured value is only due to an EMV fault or analog-digital converter offset. The voltage at the capacitor can be used to infer current flow. The goal of the plausibility check is to reduce the retained accuracy buffer during current value determination at times of low current flow. The method is therefore provided during low power flow periods, e.g., in a standby situation.

Further advantageous embodiments of the present invention are the subject matter of the dependent claims.

A suitable switching element can be, e.g., a transistor, in particular a MOSFET, or comprise one.

The method can in particular also be performed in a computer-implemented manner.

Adjustment regarding measurement uncertainties for consideration during the current measurement are preferably performed depending on the second current value. This is advantageous because the charging state can be estimated less conservatively via the adjusted measurement uncertainties in the current measurement, especially at a low current flow.

The functionality of the switching element is preferably verified at the capacitor depending on the first electrical voltage ascertained. Depending on the type and location of measurement of the first electrical voltage, the functionality of the switching element is determined if the switching element exceeds or falls below a predefined voltage. This is advantageous in order to ensure the functionality of the switching element.

The first current value is preferably compared to a predefined first current limit, the actuation being performed depending on the comparison. It can be provided, e.g., that actuation of the switching element is only performed when the predefined first current limit is not exceeded. It can also be provided that the predefined first current limit must be exceeded for a predefined first time period, and the switching element is only then actuated. This is advantageous because the method is particularly advantageous at low power consumption, as mentioned above, and switching at high currents due to possible wear of the switching element is further avoided.

Said actuation of the switching element to connect the electrical energy storage system to the consumer is preferably an actuation such that the electrical consumer is supplied with electrical energy by the electrical energy storage system. This is advantageous because the capacitor can typically store a lower amount of energy than the electrical energy storage system, so it can only supply the consumer for a short period of time, whereby the supply is restored by the connection.

The switching element is preferably actuated to connect to the capacitor depending on a second electrical voltage. This is advantageous when, e.g., connecting the electrical energy storage system directly to the consumer during exceedance of or failure to achieve a predefined voltage limit, which can in particular occur in the event of a high energy requirement by the consumer.

The object of the invention is also a computer program configured to perform all of the steps of the method described hereinabove. The aforementioned advantages can be achieved as a result.

A further object of the invention is a machine-readable storage medium on which said computer program is stored. The aforementioned advantages can be achieved as a result.

The object of the invention is also an electronic control unit configured to perform all of the steps of said method. The aforementioned advantages can be achieved as a result.

The object of the invention is also a device comprising an electronic control unit according to the invention, an electrical energy storage system, and an electrical consumer, with a capacitor and a switching element being arranged between these two elements.

BRIEF DESCRIPTION OF THE DRAWINGS

Advantageous embodiments of the invention are illustrated in the drawings and further explained in the subsequent description.

Shown are.

DETAILED DESCRIPTION

Figure 1:
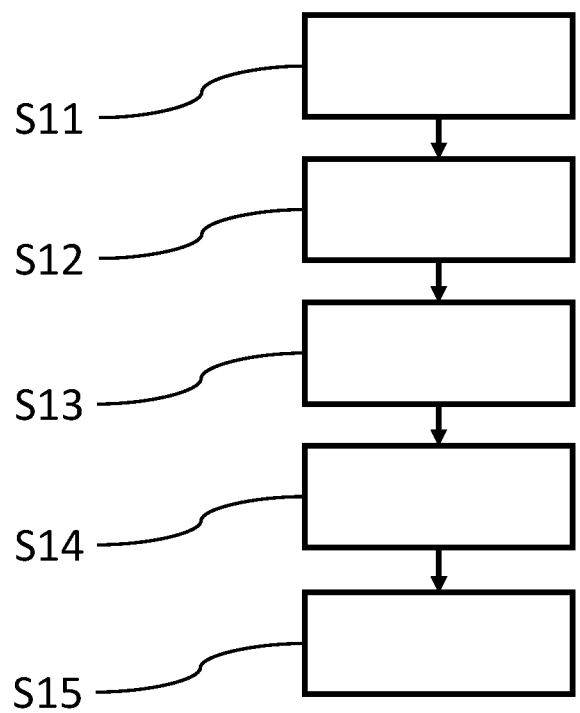
FIG. 1 a flow chart of a first embodiment of the method according to the invention.

In all of the drawings, identical reference characters denote identical device components or identical method steps.

FIG. 1 shows a flow chart of a first embodiment of the method according to the invention for checking the plausibility of a current measurement between an electrical energy storage system and an electrical consumer, with a capacitor and a switching element being arranged between these two elements.

In a first step S11, an electrical current is in this case measured between the electrical energy storage system and the electrical consumer, a first current value being determined as a result. It can as a result, e.g., be determined whether the energy storage system is in a low power consumption state.

In a second step S12, the switching element is actuated to isolate the electrical energy storage system from the electrical consumer. Once the switching element has separated the two components, the electrical consumer is supplied with electrical energy by the capacitor.

In a third step S13, a first electrical voltage is ascertained at the capacitor. The latter can in particular be performed after a predefined period of time after disconnecting the electrical energy storage system from the electrical consumer.

In a fourth step S14, a second current value is ascertained depending on the ascertained voltage. The current flow can be inferred by way of the ascertained voltage and, optionally, the predefined period of time.

In a fifth step S15, the plausibility of the current measurement is then checked by comparing the first current value with the second current value. Depending on the second current value ascertained, corresponding safety buffers or planned measurement uncertainties of the current measurement or in the current value determination can be reduced because, e.g., interference caused by electrical or electromagnetic interference or by a convertor offset can be estimated as insignificant during the second voltage measurement since any voltage change preferably takes place within the voltage range.

Figure 2:
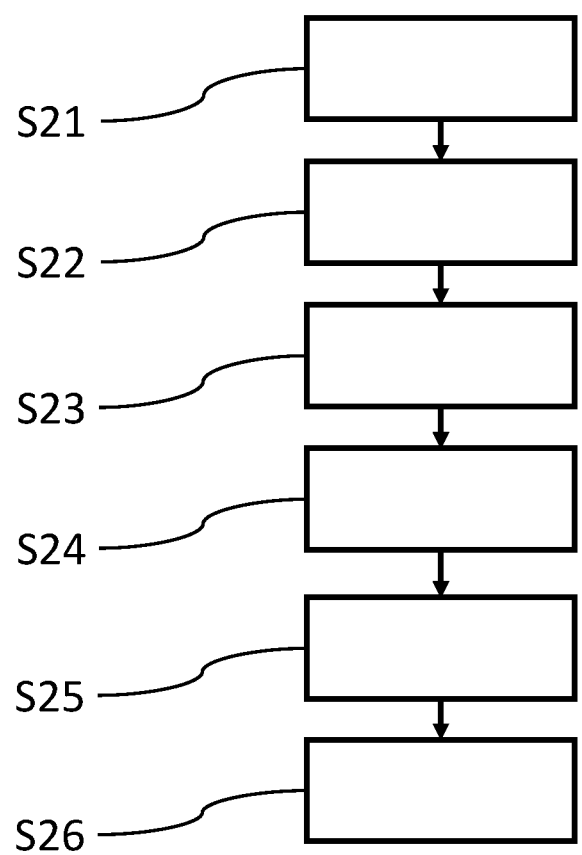
FIG. 2 a flow chart of a second embodiment of the method according to the invention.

FIG. 2 shows a flow chart of a second embodiment of the method according to the invention. Steps S21 to S25 in this case correspond to steps S11 to S15, as described above. In addition, a sixth step S26 is performed.

In the sixth step, S26, the functionality of the switching element is verified depending on the first electrical voltage ascertained at the capacitor. Doing so takes advantage of the fact that the first electrical voltage decreases with proper functionality, e.g. during disconnection, depending on the specific items measured and optionally increases again after the electrical energy storage system is connected to the consumer. If this is not the case, then proper functionality is not provided. For this purpose, the first electric voltage can, e.g., be compared to a predefined voltage limit which can be used to differentiate functionality. The sixth step S26 can in this case also be performed elsewhere as long as the step for determining the first electrical voltage at the capacitor has previously been performed, e.g., immediately after this step.

Figure 3:
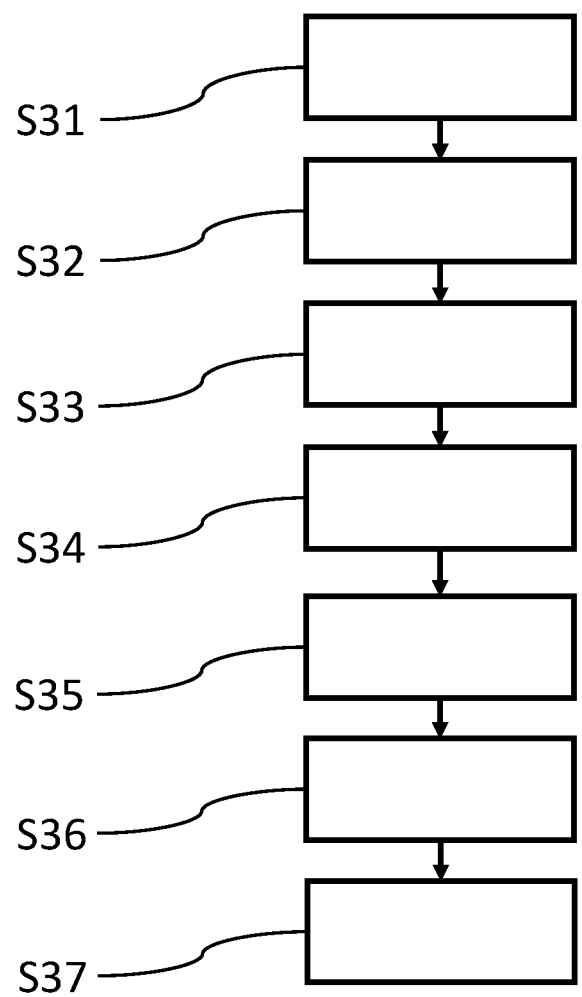
FIG. 3 a flow chart of a third embodiment of the method according to the invention.

FIG. 3 shows a flow chart of a second exemplary embodiment of the method according to the invention. The first step S31 corresponds in this case to the first step S11, as described above.

In a second step S32, the first current value thus ascertained is compared with a predefined first current limit. If the first current value is, e.g., below the predefined first current limit, the next third step S33 will proceed. Otherwise, the first step S31 is continued.

The third step S33 corresponds to the second step S12, as described above. Thereafter follow a fourth step S34, a fifth step S35, and a sixth step S36, which correspond to steps S13, S14, and S15, as described above.

In a subsequent step S37, the switching element is actuated again, this time in order to connect the electrical energy storage system to the consumer so that the latter can again be powered by the electrical energy storage system.

Alternatively and/or additionally, it can in all exemplary embodiments be provided that, if the switching element falls below or exceeds a predefined voltage limit value by the determined first voltage on the capacitor, then the switching element is actuated immediately to connect the electrical energy storage system in order to prevent any disruption of the power supply. This could, e.g., result from excessive discharge of the capacitor due to increased consumer energy consumption.

Figure 4:
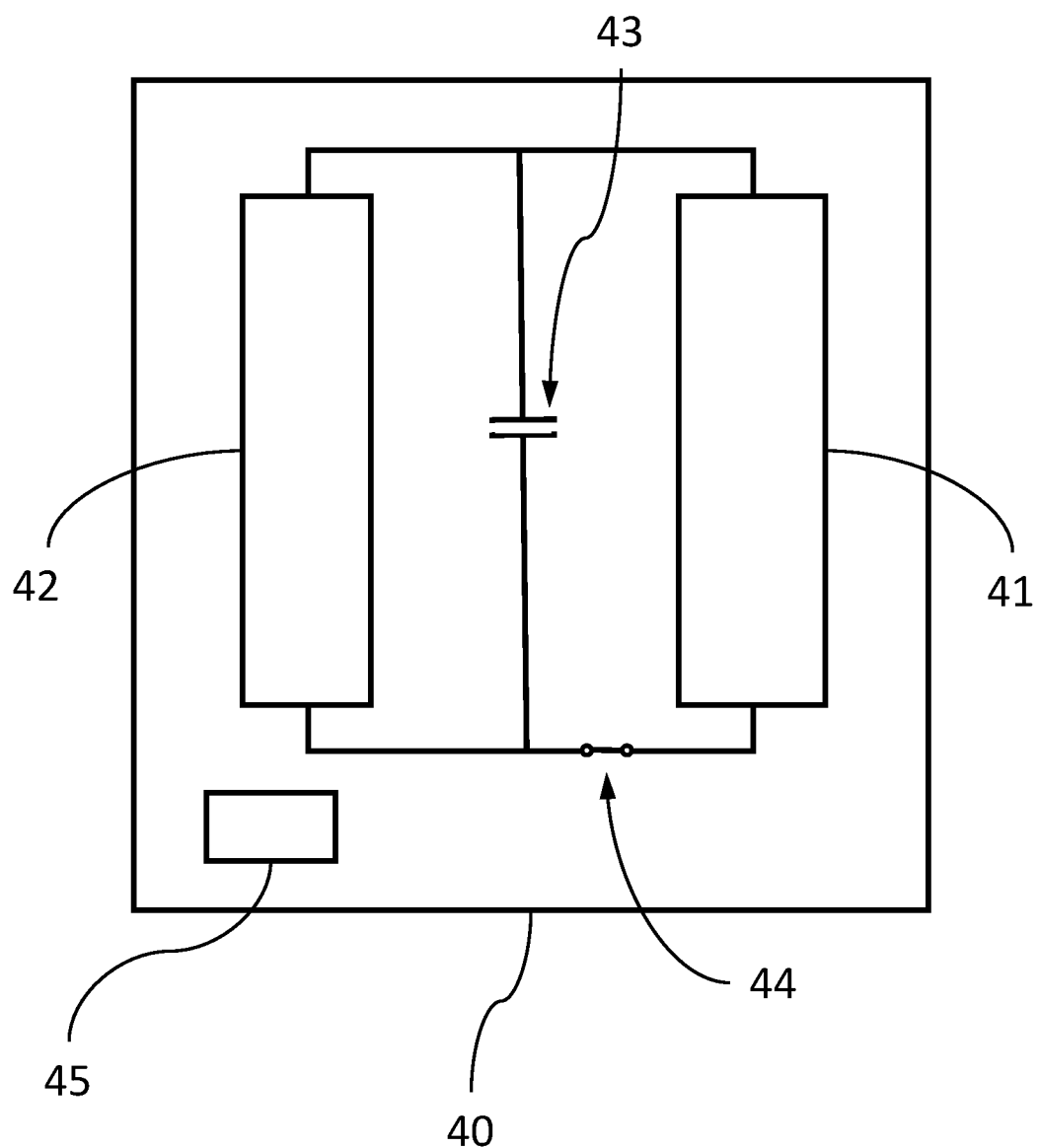
FIG. 4 a schematic illustration of one embodiment of a device according to the invention.

FIG. 4 shows a schematic representation of one embodiment of a device 40 according to the invention. The device 40 in this case comprises an electrical energy storage system 41 and an electrical consumer 42. A capacitor 43 and a switching element 44 are arranged between the energy storage system and the electrical consumer in order to isolate the electrical energy storage system 41 from the electrical consumer 42 so that the electrical consumer 42 is supplied with electrical energy when isolated from the capacitor 43. The switching element 44 in FIG. 4 is shown in the connected state. The device 40 further comprises an electronic control unit 45 configured to perform all of the steps of a method according to the present invention.

The invention claimed is:

1. A method for checking the plausibility of a current measurement between an electrical energy storage system (41) and an electrical consumer (42), wherein a capacitor (43) and a switching element (44) are arranged between these two elements, the method comprising the steps of:
 a) ascertaining a first current value by measuring an electrical current between the electrical energy storage system (41) and the electrical consumer (42);
 b) actuating the switching element (44) to isolate the electrical energy storage system (41) from the electrical consumer (42) so that the electrical consumer (42) is supplied with electrical energy by the capacitor (43);
 c) ascertaining a first electrical voltage at the capacitor (43);
 d) ascertaining a second current value depending on the ascertained voltage;
 e) checking the plausibility of the current measurement by comparing the first current value with the second current value.

2. The method according to claim 1, further comprising:
 f) adjusting measurement uncertainties intended to be considered in the current measurement depending on the second current value.

3. The method according to claim 1, further comprising:
 g) verifying the functionality of the switching element (44) depending on the first electrical voltage at the capacitor ascertained (43).

4. The method according to claim 1, further comprising:
 h) comparing the first current value with a predefined first current limit, wherein actuation of the switching element (44) for isolation is performed depending on this comparison.

5. The method according to claim 1, further comprising:
 i) actuating the switching element (44) to connect the electrical energy storage system (41) to the consumer so that the electrical consumer (42) is supplied with electrical energy by the electrical energy storage system (41).

6. The method according to claim 5, wherein the actuation is performed depending on a second electrical voltage at the capacitor (43).

7. A computer program configured to perform all of the method steps according to claim 1.

8. A machine-readable storage medium on which the computer program according to claim 7 is stored.

9. An electronic control unit (45) configured to perform the method steps according to claim 1.

10. A device (40) comprising an electrical energy storage system (41) and an electrical consumer (42), wherein a capacitor (43) and a switching element (44) are arranged between these two elements, as well as the electronic control unit (45) according to claim 9.

* * * * *